(12) United States Patent
Fuchinoue

(10) Patent No.: US 7,851,263 B2
(45) Date of Patent: Dec. 14, 2010

(54) SEMICONDUCTOR DEVICE AND METHOD OF MANUFACTURING THE SAME

(75) Inventor: Kenji Fuchinoue, Miyazaki (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 145 days.

(21) Appl. No.: 12/005,384

(22) Filed: Dec. 27, 2007

(65) Prior Publication Data

US 2008/0174006 A1 Jul. 24, 2008

(30) Foreign Application Priority Data

Jan. 19, 2007 (JP) ............................. 2007-009969

(51) Int. Cl.
*H01L 21/52* (2006.01)
*H01L 21/56* (2006.01)

(52) U.S. Cl. ...................... 438/112; 438/113; 438/119; 438/127; 257/E21.5; 257/E21.502

(58) Field of Classification Search ......... 438/106–127, 438/460–465, 462; 257/678–733, 787–796, 257/666–677, E21.499–E21.519, E25.001–E25.032, 257/E23.001–E23.194, E21.599–E21.699, 257/E21.5
See application file for complete search history.

(56) References Cited

U.S. PATENT DOCUMENTS 6,627,987 B1 * 9/2003 Glenn et al. ................ 257/704

2003/0127428 A1 * 7/2003 Fujii et al. ..................... 216/65
2005/0260797 A1 * 11/2005 Farrell et al. ................. 438/113
2006/0216955 A1 * 9/2006 Swenson et al. ............. 438/800

FOREIGN PATENT DOCUMENTS

JP 2006-179740 A 11/1999

OTHER PUBLICATIONS

JP 2006-179740 A machine translation.*

* cited by examiner

*Primary Examiner*—Matthew C Landau
*Assistant Examiner*—Aaron Staniszewski
(74) *Attorney, Agent, or Firm*—Rabin & Berdo, P.C.

(57) ABSTRACT

A method of manufacturing a semiconductor device including (1) providing a metal plate having an upper surface and a back surface, the metal plate including a plurality of lids disposed in matrix, which are defined by a first groove formed from the upper surface, (2) providing a ceramic sheet having an upper surface and a back surface, the ceramic sheet including a plurality of headers disposed in matrix, which are defined by a second groove formed from the back surface, (3) fixing the metal plate on the ceramic sheet by facing the back surface of the metal plate to the upper surface of the ceramic sheet, wherein the first groove is aligned with the second groove, and (4) dividing the metal plate and the ceramic sheet along the first and the second grooves.

14 Claims, 3 Drawing Sheets

SEMICONDUCTOR DEVICE AND METHOD OF MANUFACTURING THE SAME

CROSS-REFERENCE TO RELATED APPLICATION

This application claims the priority benefit of Japanese Patent Application No. 2007-009969, filed Jan. 19, 2007, the entire disclosure of which is incorporated herein by reference.

BACKGROUND OF THE INVENTION

1. Field of the invention

The invention relates to a semiconductor device and a method of manufacturing the same, specifically relates to a semiconductor device with a semiconductor chip encased in a hollow ceramic package and a method of manufacturing the same.

2. Description of the related art

A conventional method for encasing a semiconductor chip in a hollow ceramic package is disclosed in the reference [JP 2006-179740A]. According to JP 2006-179740A, a ceramic sheet, which is divided into a plurality of individual headers (containers) later, and a metal plate, which is divided into a plurality of individual lids for the headers later, are used for the ceramic package. The ceramic sheet includes a plurality of headers disposed in a matrix, and each header includes a cavity, which has an opening located at an upper surface of the ceramic sheet, for placing a semiconductor chip therein. The ceramic sheet also includes grooves formed at a back surface, which is opposite to the upper surface, for defining the headers. In order to manufacture a semiconductor device with a semiconductor chip encased in a hollow ceramic package, the semiconductor chip is placed in each cavity, and then is connected to the header by bonding wires. Then, the metal plate is placed on the ceramic sheet by sandwiching a sealing sheet. After that, the metal plate is fixed to the ceramic plate by using a roll electrode, which melts down the sealing sheet by electric power applied to the roll electrode. Then, after only the metal plate is diced, the ceramic sheet is divided into individual semiconductor devices in a so-called chocolate-break manner by an external force along the grooves formed therein.

However, according to the conventional method, since the surface of the metal plate on which the roller electrode is contacted is a flat surface, the contact area of the roller electrode and the metal plate is limited so that a high voltage is required to melt-down the sealing sheet for fixing the metal plate to the ceramic sheet. Further, it is not easy to divide the metal plate only by the dicing method. Moreover, two dividing steps are required in the conventional method. Namely, the first step is a dicing process for dicing the metal plate only, and the second step is a chocolate-breaking process for breaking a ceramic sheet in order to divide into the individual semiconductor devices. The complex process makes the manufacturing process complex, decreases the productivity, and increase the cost for production.

SUMMARY OF THE INVENTION

An objective of the invention is to solve the above-described problem and to provide a method for manufacturing a semiconductor device with a semiconductor chip encased in a hollow ceramic package, which includes a single step for dividing into individual semiconductor devices.

The objective is achieved by a method of manufacturing a semiconductor device including (1) providing a metal plate having an upper surface and a back surface, the metal plate including a plurality of lids disposed in matrix, which are defined by a first groove formed from the upper surface, (2) providing a ceramic sheet having an upper surface and a back surface, the ceramic sheet including a plurality of headers disposed in matrix, which are defined by a second groove formed from the back surface, (3) fixing the metal plate on the ceramic sheet by facing the back surface of the metal plate to the upper surface of the ceramic sheet, wherein the first groove is aligned with the second groove, and (4) dividing the metal plate and the ceramic sheet along the first and the second grooves.

BRIEF DESCRIPTION OF THE DRAWINGS

The invention will be more particularly described with reference to the accompanying drawings, in which.

DETAILED DESCRIPTION OF THE PREFERRED EMBODIMENTS

The preferred embodiment of the invention is explained together with drawings as follows. In each drawing, the same reference numbers designate the same or similar components.

Figure 1:
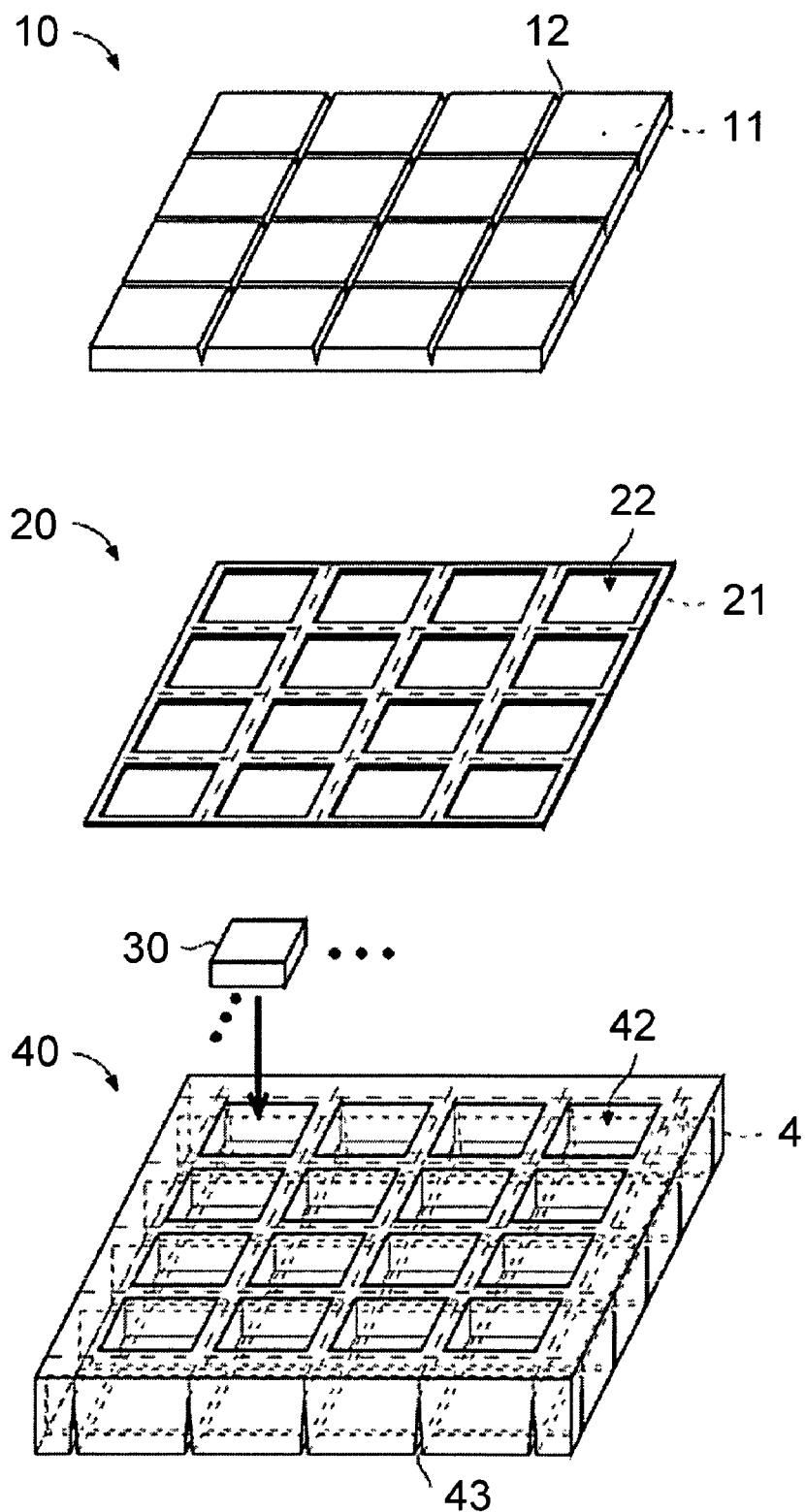
FIG. 1 is a prospective view showing components, which are a metal plate, a sealing sheet and a ceramic sheet, according to the embodiment of the invention.
Figure 3A:
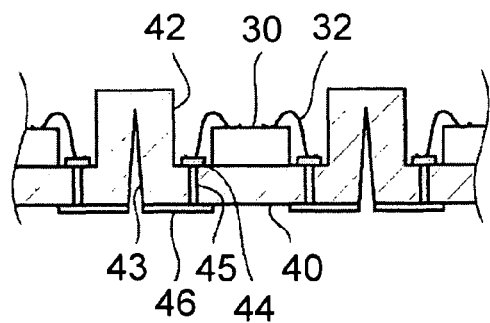
FIGS. 3A through 3C are cross-sectional views showing a process to manufacture a semiconductor device with a semiconductor chip encased in a hollow ceramic package.

The invention is described as follows with reference to FIG. 1. FIG. 1 is a prospective view showing components, which are a metal plate 10, a sealing sheet 20 and a ceramic sheet 40. A semiconductor device 1, which is a final product shown in FIG. 3C, is manufactured by the components illustrated in FIG. 1.

As shown in FIG. 1, the metal plate 10 includes a plurality of lids 11 disposed in a matrix and defined by V-shaped grooves 12. The metal plate 11 has an upper surface, which is exposed, and a bottom surface, which contacts a sealing sheet 20. The grooves 12 are formed from the upper surface. The depth of the grooves 12 is set in the range of 50%~80% of the thickness of the metal plate 10, and width of the groove 12 can be changed in response to a method of forming grooves 12 or in response to a method of bonding the metal plate 10 to the ceramic sheet 40 described later. Although it is described that the grooves 12 are V-shaped at its cross section, the conception of the invention is not limited to this shape, and the shape at its cross-section can be changed to other shapes by which the metal plate 10 can be easily divided into an individual lids by the chocolate-breaking manner. Thus, the grooves 12 are functioned as the guide for dividing into individual lids.

The ceramic sheet 40 includes a plurality of headers 41 disposed in a matrix, and each header includes a cavity 42, which has an opening located at an upper surface of the ceramic sheet, for placing a semiconductor chip 30 therein. Each header includes internal terminals 44 (illustrated in FIG. 2B) exposed within the cavity 42, external terminals 46 (illustrated in FIG. 2B) formed on its back surface, which is opposite to the upper surface, and internal wirings 45 (illustrated in FIG. 2B) connecting one of the internal terminals 44 to one of the external terminals 46. The ceramic sheet 40 also includes V-shaped grooves 43 formed at its back surface for defining the headers 41. The depth of the grooves is set in a range of 50%~80% of the thickness of the ceramic sheet 40, and width of the groove 43 can be changed in response to a method of forming grooves 43 or in response to a method of bonding the metal plate 10 to the ceramic sheet 40 described later. Although it is described that the grooves 43 are V-shaped at its cross section, the conception of the invention is not limited to this shape, and the shape at its cross-section can be changed to other shapes by which the ceramic sheet 40 can be easily divided into an individual header by the chocolate-breaking manner. Thus, the grooves 43 are functioned as the guide for dividing into individual headers.

The sealing sheet 20 for fixing the metal plate 10 to the ceramic sheet 40 includes a plurality of sealing members 21, which are disposed in matrix. Each sealing member 21 has an opening 22 at its center, which corresponds to and is aligned with the opening of one of the cavities 42 of the ceramic sheet 40. Another sealing sheet having no openings may replace the sealing sheet 20.

The semiconductor chip 30 is mounted at the bottom of the cavity 42 formed in one of the headers 42, which is encased by the ceramic sheet 40, the metal plate 10 and the sealing sheet 20. The semiconductor chip 30 stored in the cavity 42 is connected to the internal terminals 44 formed within the cavity 42 by bonding wires 32 formed of copper as shown in FIG. 3A. In this embodiment, although the bonding wires 32 are used for the electrical connection between the semiconductor chip 30 and the internal terminals 44, another connection manner can be applied. For example, the face-down bonding method can be used if the internal terminals are formed at the bottom of the cavity, and terminals of the semiconductor chip are disposed to a location, which corresponds to that of the internal terminals.

Figure 2A:
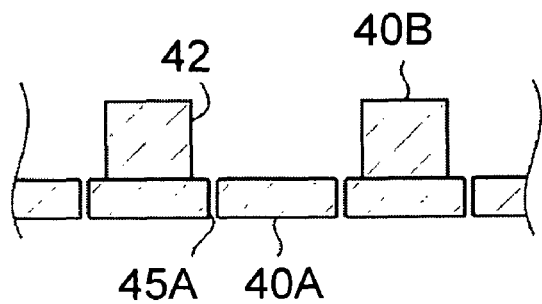
FIGS. 2A through 2C are cross-sectional views showing a process to form a ceramic sheet used in the FIG. 1.
Figure 2B:
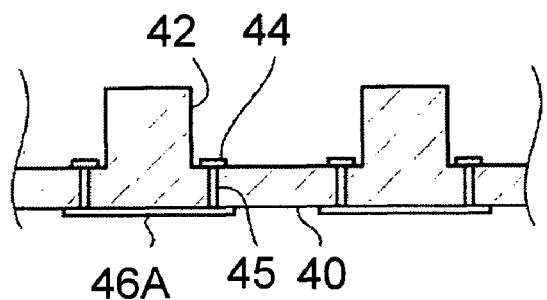
Figure 2C:
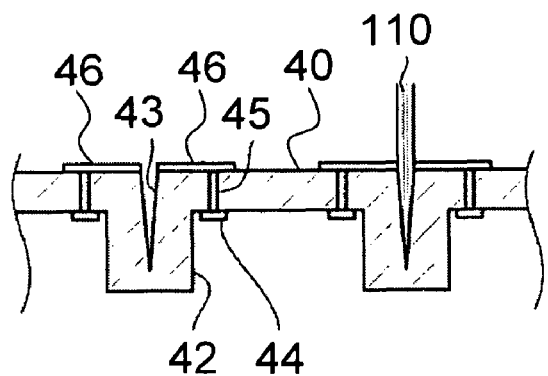
Figure 2D:
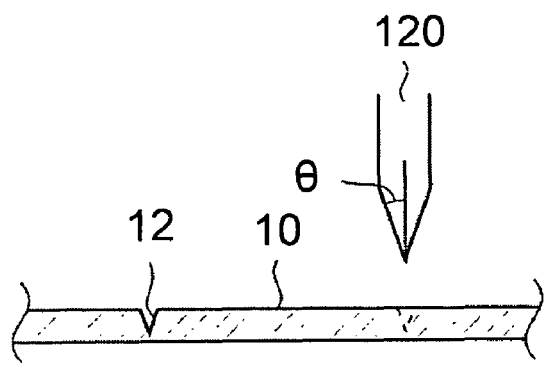
FIG. 2D is a cross-sectional view showing a process to form a metal plate used in the FIG. 1.

Next, the method of manufacturing the semiconductor device 1 with a semiconductor chip 30 encased in a hollow ceramic package is explained below with reference to FIG. 2A about FIG. 3C. FIGS. 2A through 2C are cross-sectional views showing a process to form a ceramic sheet used in the FIG. 1, FIG. 2D is a cross-sectional view showing a process to form a metal plate used in the FIG. 1, and FIGS. 3A through 3C are cross-sectional views showing a process to manufacture a semiconductor device with a semiconductor chip encased in a hollow ceramic package.

To manufacture the ceramic sheet used in this embodiment, a first green sheet 40A and a second green sheet 40B are prepared, as shown in FIG. 2A. Although the first and the second green sheets are the same shape and size in the form of the plate, the first green sheet 40A is thinner than the second green sheet 40B. The first green sheet 40A is stacked on the second green sheet 40B. The second green sheet 40B includes a plurality of cavities 42 in a matrix. The first green sheet 40A includes holes 45A in which the internal wirings 45 explained later are formed. The cavities 42 and the holes 45A are formed in the first and second green sheet, respectively, by a punching tool. After stacking the first green sheet 40A on the second green sheet 40B, they are heated so that the integrated ceramic sheet 40 is formed.

Next, as shown in FIG. 2B, the internal wirings 45 are copper-plated in the holes 45A by a well-known electrolytic plating method. The, the internal terminals 44 at the bottom of the cavities 42 and the external terminals 46A at the bottom surface of the ceramic sheet 40 are formed by a well-known screen printing method. The ceramic sheet 40 illustrated in FIG. 2B is obtained by the processes described above.

Next, as shown in FIG. 2C, the ceramic sheet 40 is half-diced from the bottom surface in order to create the grooves 43 by using a dicing blade 110. The grooves 43 are formed along breaking lines for defining individual headers. The grooves 43 have dicing faces formed by the dicing blade 110. The ceramic sheet 40 illustrated in FIG. 2C is obtained by the processes described above.

In the preferred embodiment, although the grooves 43 are formed by half-dicing the ceramic sheet 40, another manner to provide the grooves 43 may be used. For example, the ceramic sheet having grooves in which two green sheets are already integrated are formed by specifically designed molds. If the ceramic sheet having grooves, which are provided in the process of fabricating the ceramic sheet, are used, the grooves have natural faces, not the dicing faces.

To manufacture the metal plate 10 used in this embodiment, the metal plate 10 is half-diced from the upper surface along diving lines, which define the individual lids, by using a blade 120 to from the grooves 12. The metal plate 10 having the grooves 12 illustrated in FIG. 2D including dicing faces formed by the dicing blade 120 is obtained by this process. In the preferred embodiment, although the grooves 12 are formed by half-dicing the metal plate 10, another manner to provide the grooves 12 may be used. For example, if the metal plate is formed with mold having elongated projections formed in a matrix, no half-dicing process is required because the grooves are already formed at the time of fabricating the metal plate. When such the metal plate is used, the grooves in the metal plate have natural faces, not the dicing faces.

Figure 3B:
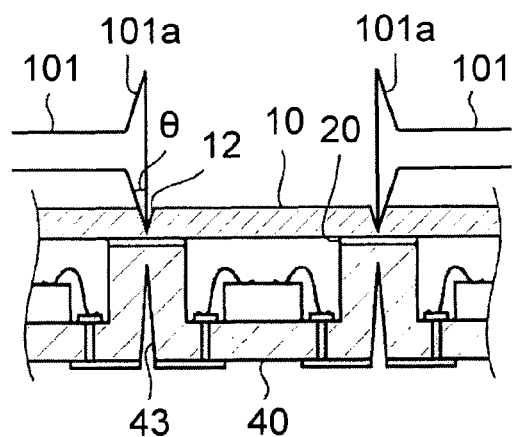
Figure 3C:
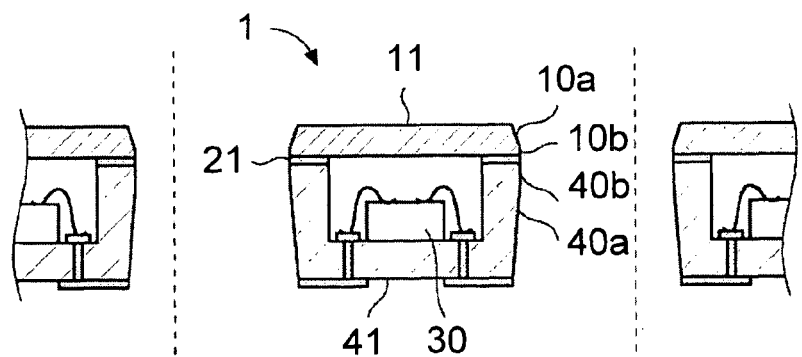

An angle θ of the tip of the blade 120 shown in FIG. 2D is set as the same as that of a peripheral edge (the contact part) of a roller electrode 101 shown in FIG. 3B. The reason why the angle of the tip of the blade is the same as that of the peripheral edge of the roller electrode 101 is explained together with the explanation for FIG. 3B. When the metal plate 10 is half-diced by the blade 120 whose tip has the angle θ, the grooves 12, which have the angle θ against the vertical direction, is formed at the upper surface of the metal plate 10.

As shown in FIG. 3A, the semiconductor chip 30 is mounted in a face-up condition at the bottom of each cavity 42 of the ceramic sheet 40, and then, the terminals formed on the semiconductor chip 30 is connected to the internal terminals 44 formed within the cavity 42 by bonding wires 32 formed of cupper.

Next, as shown in FIG. 3B, the sealing sheet 20 and the metal plate 10 are stacked on the ceramic sheet 40. Here, it is necessary to align the grooves 12 formed on the metal sheet 12 with the grooves 43 formed on the ceramic sheet 40. Then, the metal plate 10 is fixed to the ceramic sheet 40 with the sealing sheet 20 by a pair of the roller electrodes 101. Each electrode includes a conical member 101a whose peripheral edge has an elevation angle b. The roller electrodes 101 inserts into the grooves 12, and rolls in the grooves 12 while the electric current flows. Since the groove has the angle θ inclined from the vertical direction, which is the same as the elevation angle of the peripheral edge of the conical member 101a, the roller electrode 101 fits well in the grooves 12 so that the contact area of the conical member 101a of the roller electrode 101 with the metal sheet in the groove 12 becomes larger. Thus, it is possible to flow a large current with small voltage. As a result, the metal plate 10 can be fixed to the ceramic package 40 effectively. In the preferred embodiment, although a pair of the roller electrodes 101 is inserted into two grooves 12, which are disposed next to each other, they may be inserted into two grooves 12, which are not disposed next to each other. Namely, a pair of the roller electrodes 101 may be inserted into two grooves 12, which sandwiches another groove 12. Moreover, in the preferred embodiment, although the member 101a of the roller electrode 101 is conical-shaped, another shaped member can be used. For example, two conical-shaped members whose bottom surfaces are coupled with each other, each of which has an elevation angle θ at its peripheral edge, can be used for the roller electrodes. If such the roller electrodes are used, the entire surface in the grooves is contacted with the conical-shaped members of the roller electrodes. Thus, the firm fixation can be expected.

Next, as shown in FIG. 3A, the ceramic sheet 40 and the metal plate 10 are divided into individual semiconductor devices 1 by the chocolate-breaking process, that is, applying the external force from the upper surface along the grooves 12 and from the bottom along the grooves 43. After the chocolate-breaking process, the individual semiconductor device 1 with a semiconductor chip 30 encased in a hollow ceramic package formed of the header 41 and the lid 11. Here, the grooves 12, 43 are functioned as a guide for the chocolate-breaking.

The semiconductor device manufactured by the process described above includes a first breaking face 10b formed by the chocolate breaking step at the side of the lid 11 located closer to the header 41, and a second breaking face 40b formed by the chocolate breaking step at the side of the header 41 located closer to the lid 11. As described above, the semiconductor device manufactured by the process described above also includes the first dicing face 10a formed by the half-dicing process at the side of the lid 11 and the second dicing face 40a formed by the half-dicing process at the side of the header 41. Furthermore, if the grooves 12, 43 are formed during the fabrication processes of the integrated ceramic sheet 40 and the metal plate 10 as described above, the semiconductor device includes the first natural face 10a at the side of the lid 11 and the second natural face 40a at the side of the header 41.

According to the method for manufacturing a semiconductor device with a semiconductor chip encased in a hollow ceramic package, since the member 101a of the roller electrodes 101 fits well to grooves 12, melting the sealing sheet can be performed effectively. Namely, the firm fixation can be performed with the low voltage.

While the invention has been described with reference to illustrative embodiments, this description is not intended to be construed in a limiting sense. Thus, shapes, size and physical relationship of each component are roughly illustrated so the scope of the invention should not be construed to be limited to them. Further, to clarify the components of the invention, hatching is partially omitted in the cross-sectional views. Moreover, the numerical description in the embodiment described above is one of the preferred examples in the preferred embodiment so that the scope of the invention should not be construed to limit to them. For example, although the metal plate 10 is fixed to the ceramic sheet 40 with the sealing sheet 20, the metal plate 10 is fixed to the ceramic sheet 40 directly.

Various other modifications of the illustrated embodiment will be apparent to those skilled in the art on reference to this description. Therefore, the appended claims are intended to cover any such modifications or embodiments as fall within the true scope of the invention.

What I claim is:

1. A method of manufacturing a semiconductor device, comprising:
    providing a metal plate having an upper surface and a back surface, the metal plate including a plurality of lids disposed in matrix, which are defined by a first groove formed from the upper surface;
    providing a ceramic sheet having an upper surface and a back surface, the ceramic sheet including a plurality of headers disposed in matrix, which are defined by a second groove formed from the back surface;
    fixing the metal plate on the ceramic sheet by facing the back surface of the metal plate to the upper surface of the ceramic sheet, wherein the first groove is aligned with the second groove; and
    dividing the metal plate and the ceramic sheet along the first and the second grooves,
    wherein, before fixing the metal plate on the ceramic sheet, the metal plate has a first thickness in a portion at which the first groove is formed and a second thickness in a remaining portion, the second thickness is a sum of the first thickness and a depth of the first groove,
    wherein the first grooves are V-shaped, and the inner walls of the first groove is inclined with an angle θ from the vertical direction,
    wherein the metal plate is fixed on the ceramic sheet by a roller electrode, which includes at its tip a conical member whose peripheral edge is inclined with an angle θ from the vertical direction, which is the substantially the same angle of the first groove, and
    whereby the conical member fits in the first groove, and the metal plate is fixed on the ceramic sheet by rolling the conical member in the first groove while electric power is applied to the roller electrode.

2. A method of manufacturing a semiconductor device as claimed in claim 1, wherein the first groove is formed by dicing from the upper surface with a dicing blade.

3. A method of manufacturing a semiconductor device as claimed in claim 2, wherein a depth of the first groove is set in the range of 50 and 80 percents of the thickness of the metal plate.

4. A method of manufacturing a semiconductor device as claimed in claim 1, wherein the first groove is formed together with a forming of the metal plate.

5. A method of manufacturing a semiconductor device as claimed in claim 4, wherein a depth of the first groove is set in the range of 50 and 80 percents of the thickness of the metal plate.

6. A method of manufacturing a semiconductor device as claimed in claim 1, wherein the second groove is formed by dicing from the back surface with a dicing blade.

7. A method of manufacturing a semiconductor device as claimed in claim 6, wherein a depth of the second groove is set in the range of 50 and 80 percents of the thickness of the ceramic sheet.

8. A method of manufacturing a semiconductor device as claimed in claim 1, wherein the second groove is formed together with a forming of the ceramic sheet.

9. A method of manufacturing a semiconductor device as claimed in claim 8, wherein a depth of the second groove is set in the range of 50 and 80 percents of the thickness of the ceramic sheet.

10. A method of manufacturing a semiconductor device as claimed in claim 1, wherein the metal plate and the ceramic sheet is divided by applying external force to the metal plate and the ceramic sheet.

11. A method of manufacturing a semiconductor device as claimed in claim 1,
    wherein the conical member is a first conical member,
    wherein the metal plate is fixed on the ceramic sheet by the roller electrode, which includes a second conical member, which is the substantially the same shape and a size as the first conical member, whose bottom surface is fixed on a bottom surface of the first conical member.

12. A method of manufacturing a semiconductor device as claimed in claim 1, further comprising, providing a sealing sheet between the metal plate and the ceramic sheet before fixing them.

13. A method of manufacturing a semiconductor device as claimed in claim 1, wherein the back surface of the metal plate is flat.

14. A method of manufacturing a semiconductor device as claimed in claim 1, wherein, when the metal plate is fixed on the ceramic sheet, the entire back surface of the metal plate is disposed at substantially the same level from the back surface of the ceramic sheet.

* * * * *